United States Patent [19]

Schwarz et al.

[11] Patent Number: 5,537,448
[45] Date of Patent: Jul. 16, 1996

[54] SWITCHABLE PLL CIRCUIT WITH CONSTANT AMPLIFICATION GRADIENT

[75] Inventors: Detlef Schwarz, Hanover; Stefan Bartels, Bienenbüttel, both of Germany

[73] Assignee: Blaupunkt-Werke GmbH, Hildesheim, Germany

[21] Appl. No.: 205,315

[22] Filed: Mar. 2, 1994

[30] Foreign Application Priority Data

Mar. 11, 1993 [DE] Germany .................. 43 07 673.4

[51] Int. Cl.⁶ .................. H04B 1/38; H03D 3/18; H03D 3/24; H04L 7/00
[52] U.S. Cl. .................. 375/376; 375/223; 375/327; 375/371; 375/373; 375/375
[58] Field of Search .................. 375/9, 81, 118, 375/119, 120, 223, 327, 371, 373, 375, 376; 327/1, 233; 328/155, 133

[56] References Cited

U.S. PATENT DOCUMENTS

| | | | |
|---|---|---|---|
| 4,608,699 | 8/1986 | Batlivala | 375/81 |
| 4,862,513 | 8/1989 | Brägas | 455/45 |
| 4,888,564 | 12/1989 | Ishigaki | 375/120 |
| 4,926,447 | 5/1990 | Corsetto | 375/120 |
| 4,929,917 | 5/1990 | Yokogawa | 375/120 |
| 5,315,623 | 5/1994 | Kuo | 375/120 |
| 5,319,680 | 6/1994 | Port | 375/119 |
| 5,341,405 | 8/1994 | Mallard | 375/120 |

OTHER PUBLICATIONS

European Broadcasting Union Technical Standard 3244–E, entitled Specifications of the Radio Data System (RDS) for VHF/FM Sound Broadcasting (EBU Technical Centre, Brussels, Mar. '84), pp. 29–30 & table of contents.

Primary Examiner—Stephen Chin
Assistant Examiner—Vijay Shankar
Attorney, Agent, or Firm—Frishauf, Holtz, Goodman, Langer & Chick

[57] ABSTRACT

An improved Phase-Locked Loop (PLL) radio receiver circuit includes a phase detector, either an active loop filter or a set of parallel, alternately selectable loop filters, and a Voltage-Controlled Oscillator (VCO) whose input is connected to the output of the loop filter. The output of the VCO is fed to frequency divider. The output of the frequency divider and a reference frequency signal form the inputs to the phase detector/comparator. Toggling among the loop filters occurs such that the loop limit frequency, defined by a loop amplification of 1, is altered by this toggling without significantly changing the gradient of the amplification to the frequency, in a frequency range which includes the limit frequency.

9 Claims, 3 Drawing Sheets 5,537,448

SWITCHABLE PLL CIRCUIT WITH CONSTANT AMPLIFICATION GRADIENT

Cross-reference to related patent, assigned to the assignee of the present invention, the disclosure of which is hereby incorporated by reference:

U.S. Pat. No. 4,862,513, entitled Radio Receiver with Two Different Traffic Information Decoders.

Cross-reference to related literature:

European Broadcasting Union Technical Standard 3244-E entitled Specifications of the Radio Data System (RDS) for VHF/FM Sound Broadcasting (EBU Technical Centre, Brussels, Mar. 1984, 60 pages).

Phase-Locked Loops, 2nd Edition, by Roland E. Best, Ph.D. (McGraw-Hill, New York, 1993, 373 pages).

FIELD OF THE INVENTION

The invention relates generally to a circuit for generating a tuning voltage in a radio receiver.

BACKGROUND

The transient or pull-in period of Phase-Locked Loop (PLL) circuits at frequency changes is inversely proportional to the limit frequency fg of the loop. Frequency fg is that frequency where the amplification factor of the open circuit is 1, i.e. 0 dB gain. The higher the limit frequency, the faster a PLL circuit will stabilize.

However, in stabilized condition, the behavior of a PLL circuit with smaller limit frequencies is preferable. For instance, the lower the limit frequency, the higher the attenuation of a reference frequency supplied to the phase detector or comparator circuit. Especially for PLL circuits for radio receivers, where the reference frequency deviates significantly from the oscillator frequency, disturbances in the tuning voltage due to the reference frequency are noticeable.

Quick stabilization and low disturbance are, therefore, opposing requirements. Thus, a compromise has to be found for generally utilized PLL circuits. The need for a short transient or pull-in period is particularly strong for receivers that are briefly toggled between an initially received frequency and a second frequency to be checked. Such receivers are used in the ARI (registered trademark of Blaupunkt Werke) traffic information system and in the RDS system defined by the European Broadcasting Union. In car radios, this may happen in order to check whether stations with other transmitting frequencies carry either the same program, or traffic announcements valid for the same geographic area, albeit with reception at a higher field strength. This switching-over for checking is so short, that, depending on other measures used, minimal disturbance to the reception occurs.

Known circuits for switching-over, or toggling the limit frequency fundamentally operate by toggling loop amplification, for instance by toggling the output currents of the PLL circuit or by switching between resistors in the loop filter. However, by doing so, the charactistic curve, that is, the slope of the loop amplification with respect to the frequency in the range of the limit frequency, is steepened, which is associated with poorer stability of the PLL circuit.

THE INVENTION

It is an object of the invention to provide a circuit for generating a tuning voltage with a PLL circuit, in which switchover among different limit frequencies is possible, yet stable operation is possible, independent or regardless of which limit frequency is selected.

According to an embodiment of the invention, several parallel loop filters are provided, with different respective limit frequencies, with the output of the phase detector being selectively connectable to any one of the loop filter inputs. In another embodiment, the loop filter is an active filter, whose frequency-specifying element is switchable.

When using several loop filters, another transient or pull-in period of the tuning voltage occurs when switching over, or toggling from one loop filter to another loop filter.

In accordance with another embodiment of the invention a PLL circuit is provided which stabilizes quickly, for instance when tuning to a new station, as well as keeping noise low and attenuation of the reference frequency high during stationary operation. Preferably, for transitions into both operating modes, no new pull-in time of the tuning voltage should be necessary.

In a preferred embodiment, a resistor is placed between the inputs of two loop filters. The advantage of this embodiment is that the capacitor of the second loop filter already starts to follow the voltage supplied by the phase comparison circuit during the transient period via the resistor. While toggling, a voltage that is correct, at least in its tendency, or change with respect to time, is present at the capacitor of the second loop filter. Especially for integrated circuits constructed as PLL circuits, the greatest expense for implementing the invention consists merely of an additional resistor. This embodiment can also be used in other applications than the ones covered here.

DRAWINGS

Further features of the preferred embodiments will be apparent from the drawings, of which:

DETAILED DESCRIPTION

Figure 2:
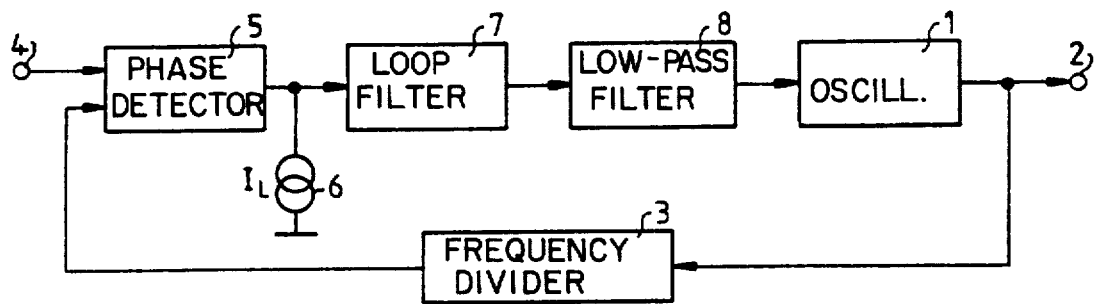
FIG. 2 is a block diagram of a known PLL circuit.

In the known circuit according to FIG. 2, a controllable oscillator 1 is controlled by a tuning voltage U, while at output 2 of oscillator 1 the alternating voltage generated by the oscillator is supplied to a mixer (not shown). In addition, the output signal of oscillator 1 is supplied to a programmable frequency divider 3, which is used to specify the desired incoming frequency. The output signal of the frequency divider 3 is fed to a phase detector 5, together with a reference frequency applied from a terminal 4 to another input of the phase detector.

The output of phase detector 5 is shown connected to a current source 6. Current source 6 symbolizes the leakage currents $I_1$ occurring at the input of loop filter 7, which must be compensated for by the current source, indicated schematically, at the output of phase detector 5. Since this compensation is generally achieved through current pulses, a high leakage current leads to high current pulses during the stabilized state, and thus to disturbances or perturbations in the tuning voltage of oscillator 1. This necessitates increased interference suppression through loop filters having lower limit frequencies.

Figure 3:
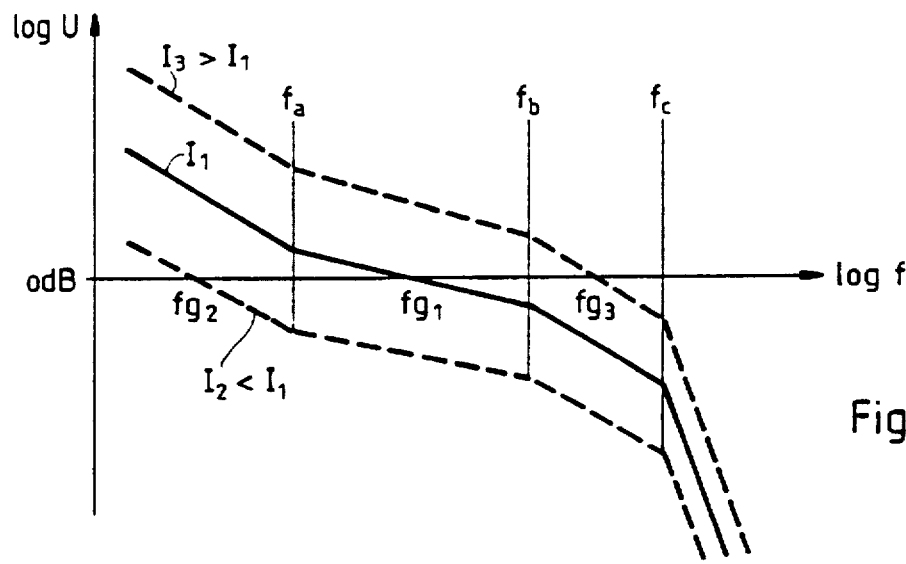
FIG. 3 is a Bode diagram for the known circuit of FIG. 2.

The output current of phase detector 5 is fed to a loop filter 7, whose output is connected to the control input of oscillator 1 via a low-pass filter 8. To describe the characteristics of such PLL circuits, their behavior is observed with the loop open, that is, the loop amplification in relation to the frequency, which is shown as a Bode diagram in FIG. 3 for the known circuit according to FIG. 2. Both amplification and frequency are plotted logarithmically. In the diagram, the solid curve drawn in the middle represents a mean loop current $I_1$=output current of the phase detector 5, with the limit frequency $fg_1$. The loop filter 7 has the limiting frequencies $f_a$ and $f_b$, while the limiting frequency of the low pass filter 8 is found at $f_c$.

If the limit frequency is to be raised to achieve a shorter transient period or pull-in time, the current in the circuit of FIG. 2 is raised, for instance to a value $I_3$. This also raises the limit frequency, but it is now in a segment or branch of the curve that is steeper. This is accompanied by less favorable stability behavior. The same is true for a lower current $I_2$ with a limit frequency $fg_2$.

Figure 4:
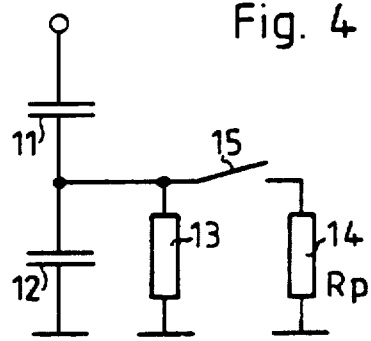
FIG. 4 is another known (loop filter) circuit.
Figure 5:
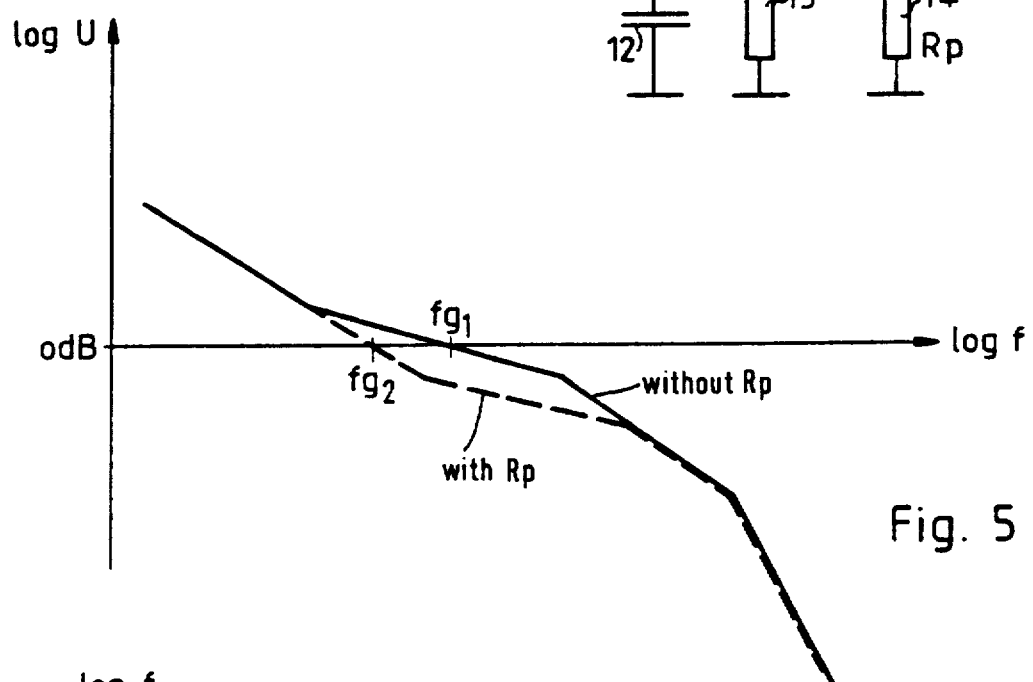
FIG. 5 is a Bode diagram for the known circuit of FIG. 2 with the use of a loop filter according to FIG. 4.

FIG. 4 shows another known possibility for changing the limit frequency of a PLL circuit, which consists of an additional resistor 14, being connected in parallel by a switch 15 to a filter consisting of capacitors 11, 12 and resistor 13, to achieve a higher limit frequency. The amplification characteristic curve of the filter according to FIG. 4, which is drawn as a solid line in FIG. 5, will, without resistor 14, shift to the curve represented by the dashed line. The slope in the range of limit frequency $fg_2$ is again steeper than the slope at $fg_1$.

Figure 1:
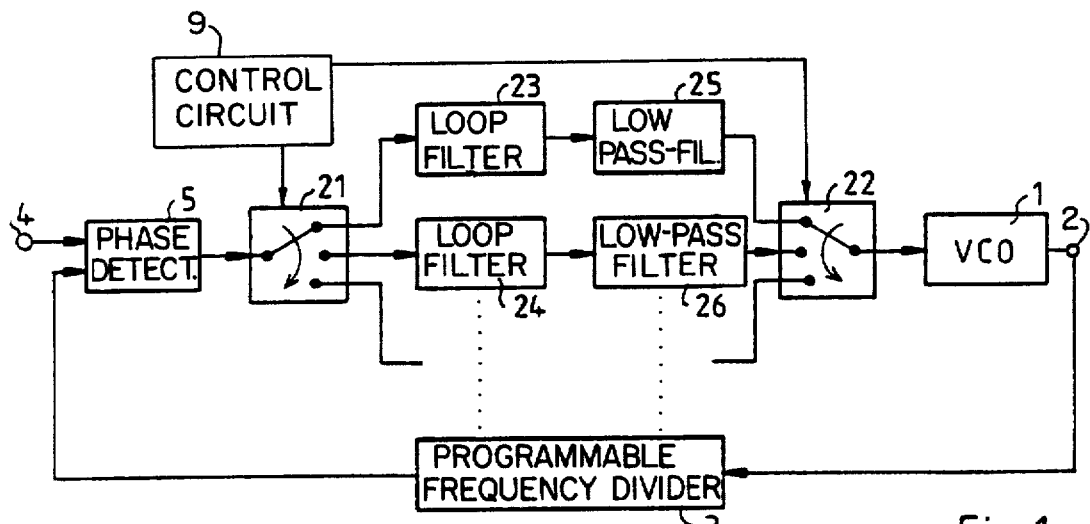
FIG. 1 is a block diagram of a first embodiment.
Figure 6:
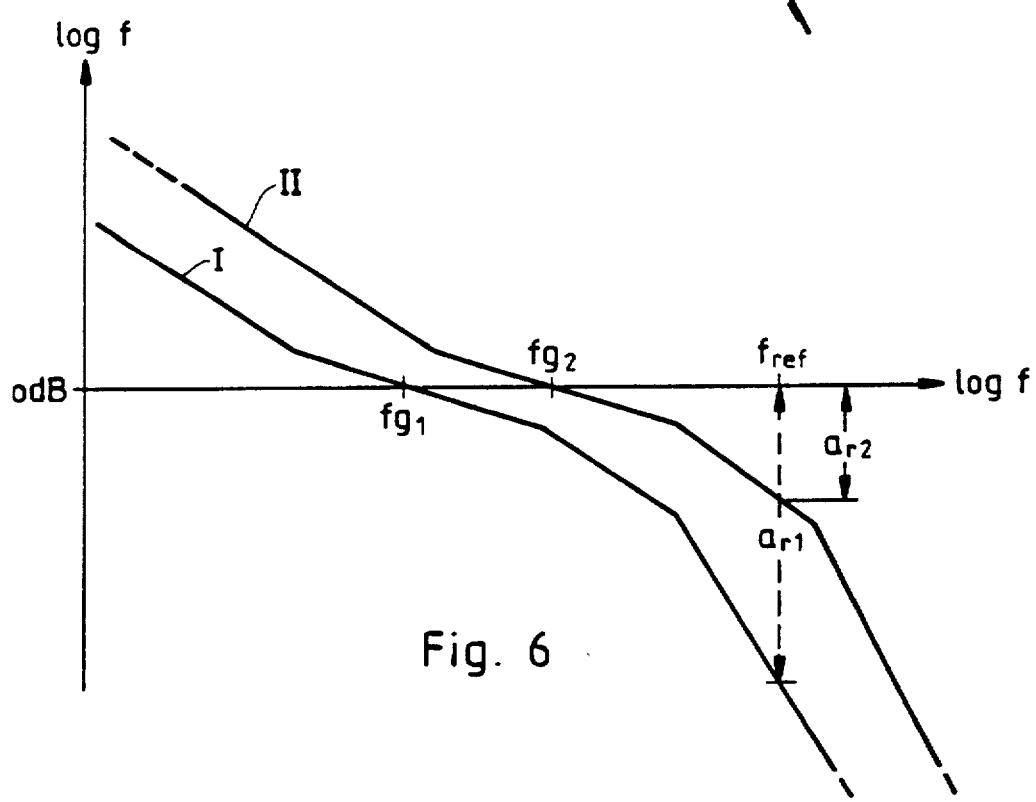
FIG. 6 is a Bode diagram for the FIG. 1 embodiment of the present invention.

In the circuit embodiment of the invention shown in FIG. 1, controllable change over, or toggle switches 21, 22 are provided respectively at the output of phase detector 5, and at the control input of voltage controlled oscillator 1. These toggle switches selectively connect one of several serial circuits, each consisting of one of the loop filters 23, 24 and one of the low-pass filters 25, 26. Switches 21, 22 are actuated simultaneously by a control circuit 9, which may be of any suitable conventional structure. For most applications, toggling between two loop filters is sufficient; toggling between more than two limit filters is possible with the invention as well. The loop filters are designed such that, even though the limit frequency changes, there is no absolute change in amplification. This is shown in FIG. 6.

The curve designated II is valid for a loop filter with a higher limit frequency, $fg_2$ which enables faster stabilization. With the curve designated I, with the limit frequency $fg_1$, good interference suppression is achieved, which is shown in FIG. 2 with the example of the reference frequency $f_{ref}$. For this frequency, graph II has a lower attenuation or damping $a_{r2}$, which increases up to the value $a_{r1}$ when changing over the loop filters.

Figure 7:
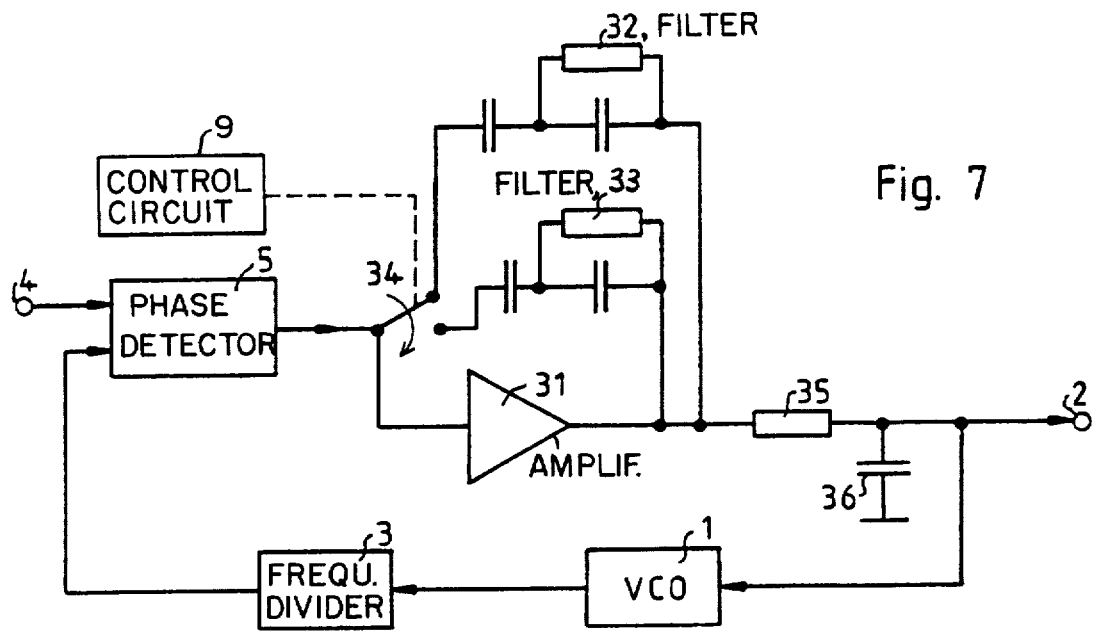
FIG. 7 illustrates a second embodiment of the circuit of the present invention; and, FIG. 8 illustrates a third embodiment of the circuit of the present invention. Similar components are designated with the same reference numeral in each figure.

FIG. 7 shows an embodiment with an active loop filter, consisting of an amplifier 31 and two filters 32, 33, arranged in parallel to amplifier 31 in inverse feedback, selectively connected into the circuit by the transfer switch 34. Again, transfer switch 34 is actuated by control circuit 9. For both limit frequencies that can be achieved with the active loop filter, a single low-pass filter, consisting of resistor 35 and capacitor 36, is sufficient.

Figure 8:
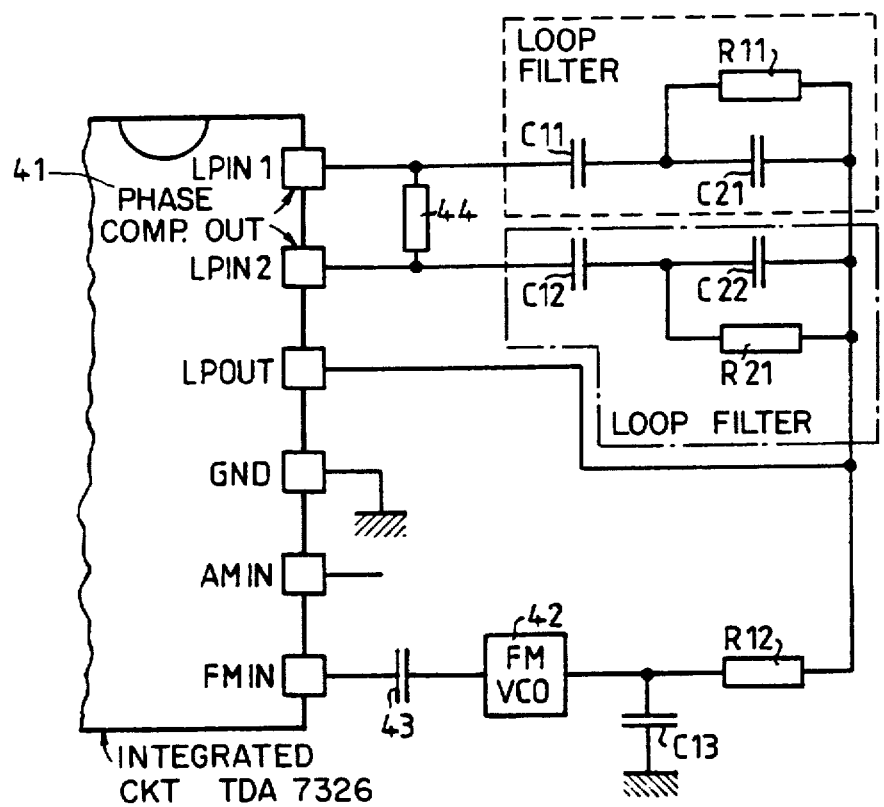

In the embodiment according to FIG. 8, the reference numeral 41 represents a generally known integrated circuit, for instance a model TDA 7326 commercially available from SGS-Thomson, which contains all important components of a PLL circuit, with the exception of a controllable Voltage-Controlled Oscillator (VCO) 42 and the loop filters. This embodiment in particular contains a programmable frequency divider and a phase comparator circuit. The latter has two outputs LPIN1 and LPIN2, one of which is active depending on the pull-in or transient state. Output LPIN1 is connected with a control input of oscillator 42 via one loop filter, consisting of capacitors C11, C21, and resistor R11, and via a low-pass filter R12, C13. The output of oscillator 42 is connected to an input FMIN of the integrated circuit 41 via a capacitor 43.

The second output LPIN2 of the integrated circuit 41 is connected with the control input of oscillator 42 via the other loop filter, consisting of capacitors C12, C22, and resistor R21, and via the low-pass filter R12, C13. According to the invention, the two outputs LPIN1 and LPIN2 are cross connected via a resistor 44. Resistor 44 is large enough that the characteristics of the two loop filters, which determine the circuit's behavior during stabilization and in the stationary phase, will basically remain the same or, in other words, the loop filter characteristics are essentially unaffected by the resistor 44. However, during the pull-in or transient period, it will cause gradual charging of capacitor C12 to the stabilizing voltage via the first loop filter C11, C21, R11. As soon as it has attained a somewhat stable value at the end of the transient period, the integrated circuit 41 switches output LPIN2 on and output LPIN1 off. The second loop filter is already in a mode where it can operate without any further perturbing stabilization or pull-in process.

Various changes and modifications are possible within the scope of the inventive concept.

We claim:

1. An improved Phase-Locked Loop (PLL) circuit, for a radio receiver, comprising a Voltage-Controlled Oscillator (VCO) (1) having a control input;

a frequency divider (3) having an input, coupled to an output of said VCO (1), and a frequency divider output;

a phase detector (5) having a first input connected to said frequency divider output and a second input (4) receiving a reference frequency signal; and a plurality of series circuits, each comprising a loop filter (23, 24) and a low-pass filter (25, 26), interconnecting an output of said phase detector (5) with an input of said VCO (1);

wherein each of the loop filters has a different respective limit frequency, defined as that frequency at which an open phase control loop has an amplification factor of 1, and respective switch means (21, 22) are provided at the output of the phase detector (5) and at the control input of the VCO (1) for switching among said plurality of series circuits while maintaining a substantially constant gradient of loop amplification with respect to frequency in a frequency range which includes the respective limit frequency of the respective loop filter.

2. Circuit according to claim 1, wherein the loop filters (23; 24) of said plurality have their inputs alternately connected with the phase detector (5).

3. Circuit according to claim 2, wherein each one of the loop filters (23; 24) is connected in series with a respective low-pass filter (25, 26); and wherein the outputs of the low-pass filters (25, 26) are selectively, alternately connected with the control input of the voltage controlled oscillator (1).

4. Circuit according to claim 2, wherein the loop filters (C11, C21, R11; C12, C22, R21) are connected with a low-pass filter (12, 13) common to said loop filters.

5. Circuit according to claim 2, wherein a resistor (44) is placed between the inputs of two of said loop filters (C11, C21, R11; C12, C22, R21).

6. Circuit according to claim 5, wherein the resistor (44) is dimensioned large enough that the low-pass filter created by the resistor (44) and a capacitor of the loop filter following the resistor has a limit frequency that is lower than the limit frequency of the loop filter with the lower limit frequency.

7. Circuit according to claim 1, wherein the loop filter (31, 32, 33) is an active filter whose frequency-specifying members (32; 33) can be switched in circuit.

8. An improved Phase-Locked Loop (PLL) circuit, for a radio receiver, comprising a Voltage-Controlled Oscillator (VCO) (1) having a control input;

a frequency divider (3) having an input, coupled to an output of said VCO (1), and a frequency divider output;

a phase detector (5) having a first input connected to said frequency divider output and a second input (4) receiving a reference frequency signal; and a loop filter interconnecting an output of said phase detector (5) with the control input of said VCO (1);

wherein said loop filter is an active filter and comprises an amplifier (31);

a plurality of parallel connected alternately selectable filters (32, 33) having different limit frequencies; and switch means (34) at the output of the phase detector (5) for switching from said amplifier (31) selectively among said plurality of parallel connected alternately selectable filters while maintaining a substantially constant gradient of loop amplification with respect to frequency in a frequency range which includes said limit frequency.

9. A phase control loop maintaining a substantially constant gradient of loop amplification with respect to frequency, comprising:

two parallel connected loop filters (C11, C21, R11; C12, C22, R21) having respectively different limit frequencies, said loop filters being connected in parallel, and each having an input capacitor (C11, C12); and a resistor (44), cross connected between the inputs of the parallel connected two loop filters (C11, C21, R11; C12, C22, R21), wherein one loop filter, in dependence on its transient condition, is supplied with signals arising in the phase control loop;

wherein said resistor (44) has a resistance value which is dimensioned large enough to leave the characteristics of the loop filters (C11, C21, R11; C12, C22, R21) essentially unaffected, whereby, during transient conditions, one of the input capacitors (C12) in one (C12, C22, R21) of the loop filters will be gradually charged through said resistor (44) to a stabilizing voltage via the other one (C11, C21, R11) of the loop filters; and wherein said cross connected resistor (44) is further dimensioned large enough so that the low-pass filter formed by said cross connected resistor and a capacitor (C12) of the loop filter (C12, C22, R21) receiving current through the cross connected resistor (44) has a limit frequency that is lower than the limit frequency of the loop filter with the lower limit frequency.

* * * * *